United States Patent
Lee et al.

(10) Patent No.: US 10,120,476 B1
(45) Date of Patent: Nov. 6, 2018

(54) SELF-CAPACITANCE ORGANIC LIGHT EMITTING TOUCH DISPLAY APPARATUS

(71) Applicant: SUPERC-TOUCH CORPORATION, New Taipei (TW)

(72) Inventors: Hsiang-Yu Lee, New Taipei (TW); Shang Chin, New Taipei (TW); Ping-Tsun Lin, New Taipei (TW); Chia-Hsun Tu, New Taipei (TW)

(73) Assignee: SUPERC-TOUCH CORPORATION, New Taipei (TW)

( * ) Notice: Subject to any disclaimer, the term of this patent is extended or adjusted under 35 U.S.C. 154(b) by 0 days.

(21) Appl. No.: 15/588,675

(22) Filed: May 7, 2017

(51) Int. Cl.
*G06F 3/041* (2006.01)
*G06F 3/044* (2006.01)
*G09G 3/3225* (2016.01)

(52) U.S. Cl.
CPC ............ *G06F 3/0412* (2013.01); *G06F 3/044* (2013.01); *G06F 3/0416* (2013.01); *G09G 3/3225* (2013.01); *G06F 2203/04107* (2013.01)

(58) Field of Classification Search
CPC .................. G06F 3/0412; G06F 3/044; G09G 2300/0426
See application file for complete search history.

(56) References Cited

U.S. PATENT DOCUMENTS

| | | | |
|---|---|---|---|
| 2014/0111476 A1* | 4/2014 | You | G09G 3/3655 345/174 |
| 2014/0306906 A1* | 10/2014 | Huang | G06F 3/0418 345/173 |
| 2015/0091849 A1* | 4/2015 | Ludden | G06F 3/0412 345/174 |

* cited by examiner

*Primary Examiner* — Chun-Nan Lin
(74) *Attorney, Agent, or Firm* — Chun-Ming Shih; HDLS IPR Services

(57) ABSTRACT

A self-capacitance organic light emitting touch display apparatus includes a thin film transistor substrate, a common electrode layer, an organic light emitting material layer, at least a touch electrode layer including a plurality of touch sensing electrodes, a display controller, and a touch controller. During touch sensing, the touch controller sequentially or randomly applies a capacitance exciting signal to a selected touch sensing electrode, and senses a touch sensing signal at the selected touch sensing electrode. The touch controller applies a shielding reflection signal to the common electrode layer or a reference point of the display controller.

12 Claims, 18 Drawing Sheets

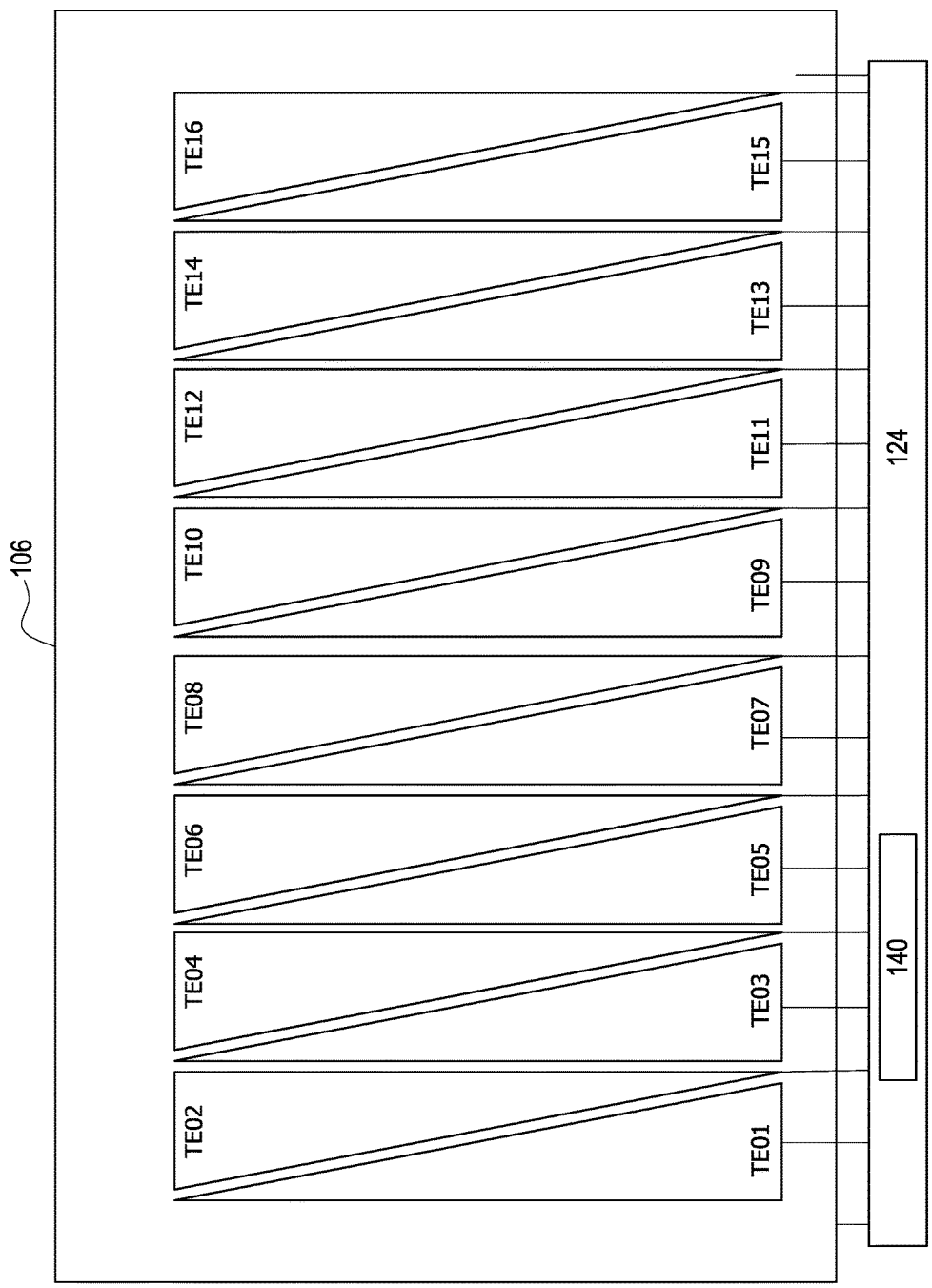

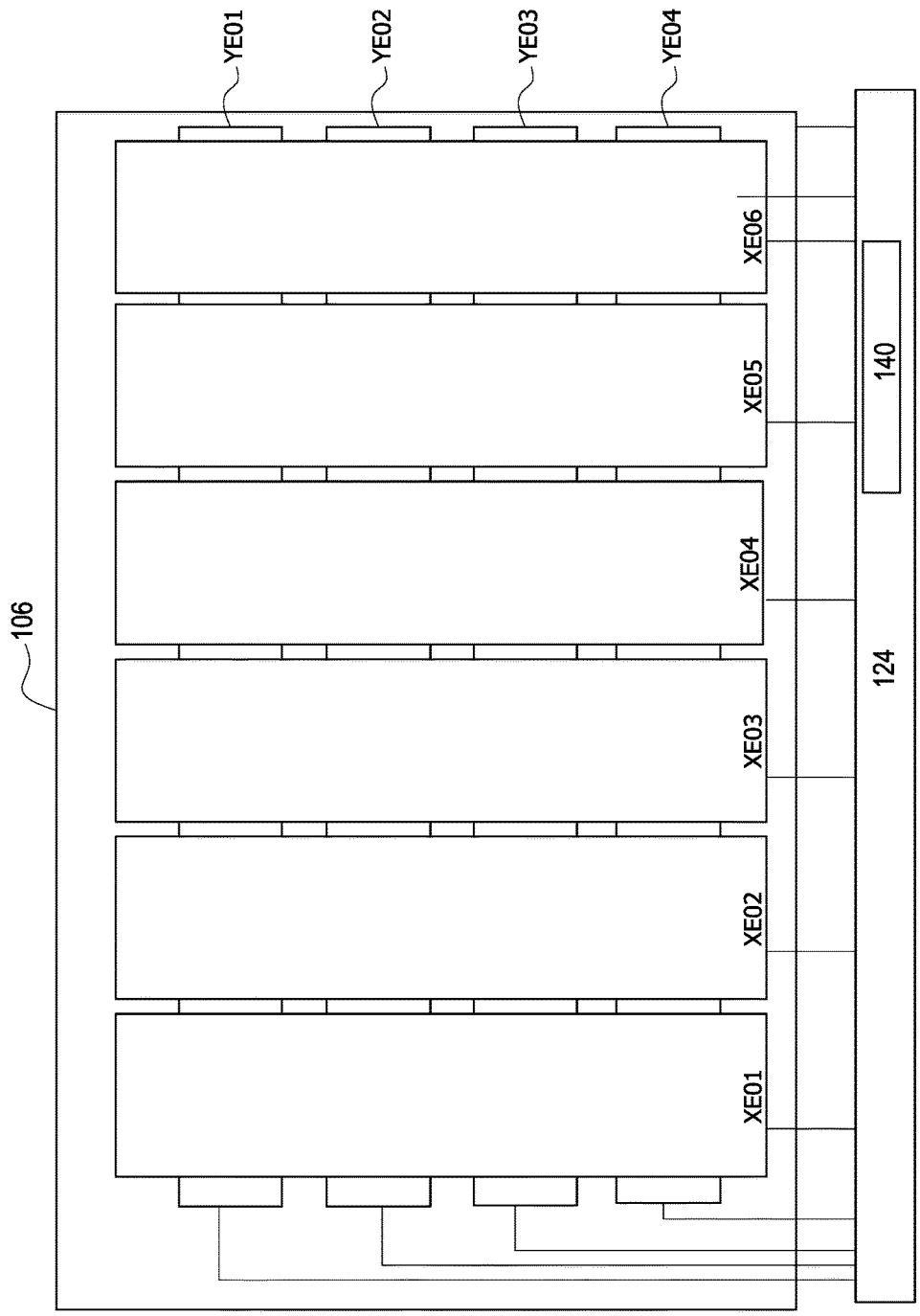

XEn(YEn)
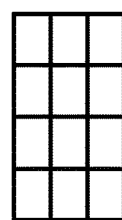 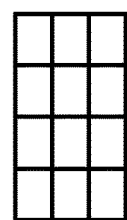
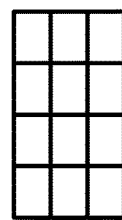 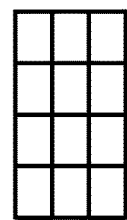
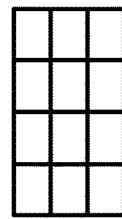 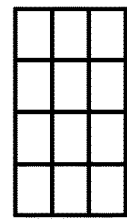
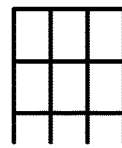 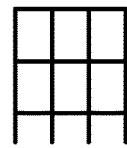
FIG.18

SELF-CAPACITANCE ORGANIC LIGHT EMITTING TOUCH DISPLAY APPARATUS

BACKGROUND OF THE INVENTION

Field of the Invention

The present invention relates to an organic light emitting touch display apparatus, especially to a self-capacitance organic light emitting touch display apparatus.

Description of Prior Art

To replace heavy cathode tube display, there comes panel display like liquid crystal display, plasma display and organic light emitting diode display, etc. Touch display panel develops with popular mobile device, and mobile electronic device grows lighter and thinner, thus embedded touch display panel becomes popular quickly. However, there is large background stray capacitance due to small separation between touch electrode and common voltage electrode of liquid crystal panel (or common cathode/common anode of OLED panel), if the touch electrode is embedded in panel structure. Therefore, this discourages the use of mutual capacitance touch scheme with advantages of fewer wirings, easy multi-points detection, and simple circuit. Thus, it is needed to overcome difficulty of sensing touch capacitance under large background stray capacitance, and removing large noise from the background stray capacitance.

SUMMARY OF THE INVENTION

Accordingly, the present invention is directed to provide a self-capacitance organic light emitting touch display apparatus.

The present invention discloses a self-capacitance organic light emitting touch display apparatus, the self-capacitance organic light emitting touch display apparatus includes: a thin film transistor substrate having a plurality of thin film transistors, a plurality of pixel electrodes, a plurality of gate lines and a plurality of data lines arranged on a surface of the thin film transistor substrate, the thin film transistors respectively connected to the pixel electrodes, the gate lines and the data lines corresponding to the thin film transistors; a common electrode layer; an organic light emitting material layer arranged between the common electrode layer and the thin film transistor substrate; at least a touch electrode layer arranged on a side of the common electrode layer, the side opposite to the organic light emitting material layer, the touch electrode layers including a plurality of touch sensing electrodes; a display controller having a display power source, and electrically connected to the thin film transistors, the pixel electrodes and the common electrode layer; a touch controller including a touch power source, the touch controller sequentially or randomly applying a capacitance exciting signal to a selected touch sensing electrode, and sensing a touch sensing signal at the selected touch sensing electrode, the touch controller also applying a shielding reflection signal to the common electrode layer or a reference point of the display controller, for the touch controller performing touch sensing, and no common current loop being present between the display controller and the touch controller during touch sensing.

BRIEF DESCRIPTION OF DRAWING

One or more embodiments of the present disclosure are illustrated by way of example and not limitation in the figures of the accompanying drawings, in which like references indicate similar elements. These drawings are not necessarily drawn to scale.

FIG. 6 shows a schematic view of a touch sensing electrode distribution of a self-capacitance organic light emitting touch display apparatus of the present invention.

FIG. 7 shows a schematic view of another touch sensing electrode distribution of a self-capacitance organic light emitting touch display apparatus of the present invention.

FIG. 18 shows a schematic view of a metal grid electrode.

DETAILED DESCRIPTION OF THE INVENTION

Figure 1A:
FIGS. 1A-1B show stack diagrams of self-capacitance organic light emitting touch display apparatuses according to different embodiments of the present invention.

Refer to FIG. 1A, FIG. 1A shows a stack diagram of a self-capacitance organic light emitting touch display apparatus 10 (hereafter touch display apparatus 10) according to an embodiment of the present invention, the touch display apparatus 10 includes, from top to bottom, a touch protection layer 116, a touch electrode layer 112, a thin film encapsulation (TFE) layer 108, a common electrode layer 106, an organic light emitting material layer 104 and a thin film transistor substrate 102. The thin film transistor substrate 102 includes, from top to bottom, a pixel electrode layer 130, a thin film transistor layer 128 and a transistor substrate 126. The touch protection layer 116 is arranged on a side of the touch electrode layer 112, the side is opposite to the thin film encapsulation layer 108, and the touch protection layer 116 is a substrate or a cured coating layer, polymer material such as glass, PI, PE, PET, etc. The touch electrode layer 112 may be made of transparent conductive material (such as ITO) or metal grid (described later). The thin film encapsulation layer 108 may also be an upper substrate or protection layer (isolating water or air), and arranged between the touch electrode layer 112 and the common electrode layer 106. The common electrode layer 106 is arranged on the organic light emitting material layer 104, making the organic light emitting material layer 104 arranged between the common electrode layer 106 and the thin film transistor substrate 102. Refer to FIG. 6, FIG. 6 shows an implementation of the touch electrode layer 112 of the touch display apparatus 10 shown in FIG. 1A, the touch electrode layer 112 includes a plurality of touch sensing electrodes TE01-TE16 coplanar with the touch electrode layer 112. The touch sensing electrodes TE01-TE16 may be implemented with shape of polygons (such as triangles) staggered with each other, and isolated with each other.

Figure 8:
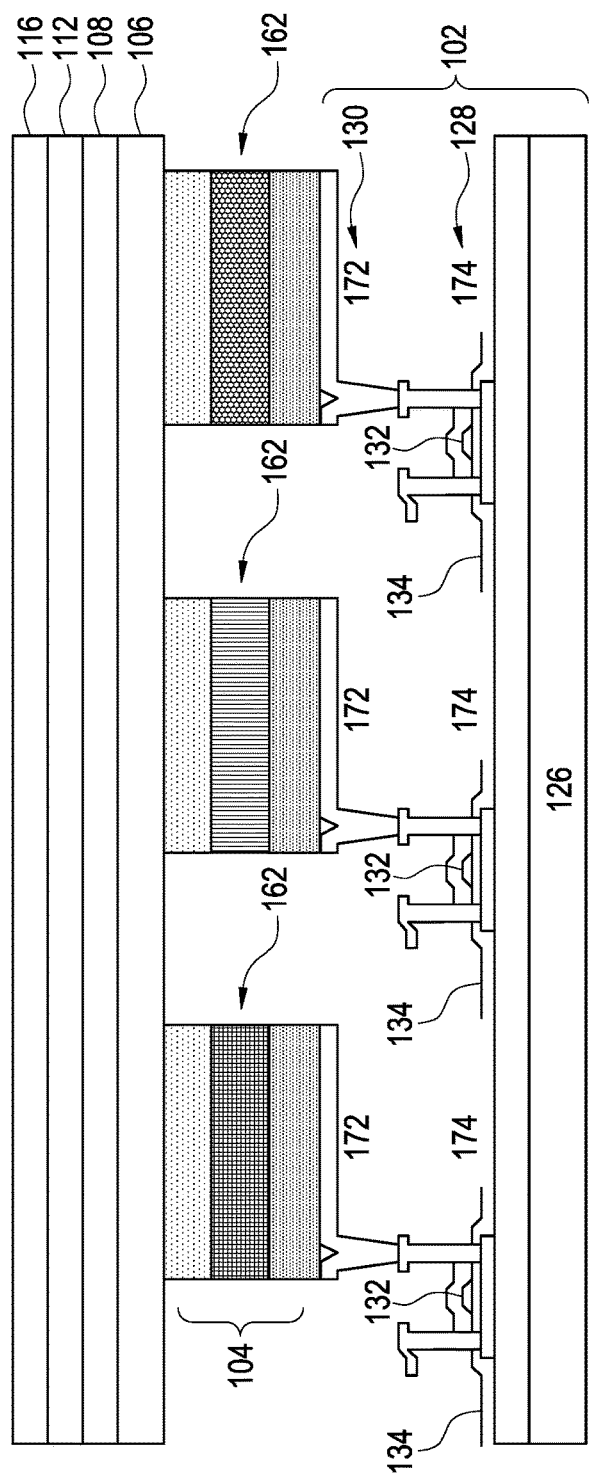
FIG. 8-14 show schematic views of detail structures of self-capacitance organic light emitting touch display apparatuses according to different embodiments of the present invention.

Refer to FIG. 8, FIG. 8 shows detailed structure diagram corresponding to touch display apparatus 10 according to embodiments in FIG. 1A and FIG. 6. As shown in FIG. 8, the pixel electrode layer 130 includes a plurality of pixel electrodes 172; the thin film transistor layer 128 includes a plurality of thin film transistors 174. The pixel electrodes 172 are arranged correspondingly to the thin film transistors 174. A polarity of the plurality of pixel electrodes 172 is reverse to that of the common electrode layer 106 (that is, if the pixel electrode 172 is anode, the common electrode layer 106 is cathode; if the pixel electrode 172 is cathode, the common electrode layer 106 is anode). The thin film transistors 174 are arranged on the transistor substrate 126. The thin film transistor substrate 102 further includes a plurality of gate lines 132 and a plurality of data lines 134, the gate lines 132 are electrically connected to the thin film transistors 174 respectively, the data lines 134 are electrically connected to the thin film transistors 174 respectively. Besides, the organic light emitting material layer 104 includes a hole transporting layer (HTL) and an electron transporting layer (ETL), and a plurality of organic light emitting materials 162 are arranged between the HTL and the ETL. The organic light emitting materials 162 in the organic light emitting material layer 104 shown in FIG. 8 emit light with colors different from each other, for example, materials emitting red light, green light, and blue light respectively.

Figure 1B:

Refer to FIG. 1B, FIG. 1B shows a stack diagram of the touch display apparatus 10 according to another embodiment of the present invention, the touch electrode layer 112 of the touch display apparatus 10 includes, from top to bottom, a second touch electrode layer 113, an insulation layer 115 and a first touch electrode layer 111. Refer to FIG. 7, FIG. 7 shows an implementation of the touch electrode layer 112 corresponding to the embodiment in FIG. 1B, the second touch electrode layer 113 includes a plurality of second touch sensing electrodes XE01-XE06 (arranged along the second direction), while the first touch electrode layer 111 includes a plurality of first touch sensing electrodes YE01-04 (arranged along the first direction). The first direction is not parallel to the second direction, and may be substantially perpendicular to the second direction. Moreover, the second touch sensing electrodes XE01-XE06 and the first touch sensing electrodes YE01-04 shown in FIG. 7 are electrically isolated from each other by the insulation layer 115 (shown in FIG. 1B), and thus making electrical isolation. In other words, there is an isolation layer between the first touch sensing electrodes YE01-04 and the second touch sensing electrodes XE01-XE06 thereon, for electrical isolation there between. The touch controller 124 sequentially or randomly applies a capacitance exciting signal to a selected touch sensing electrode (the first touch sensing electrode or second touch sensing electrode), and senses a touch sensing signal at the selected touch sensing electrode for touch sensing.

Figure 9:
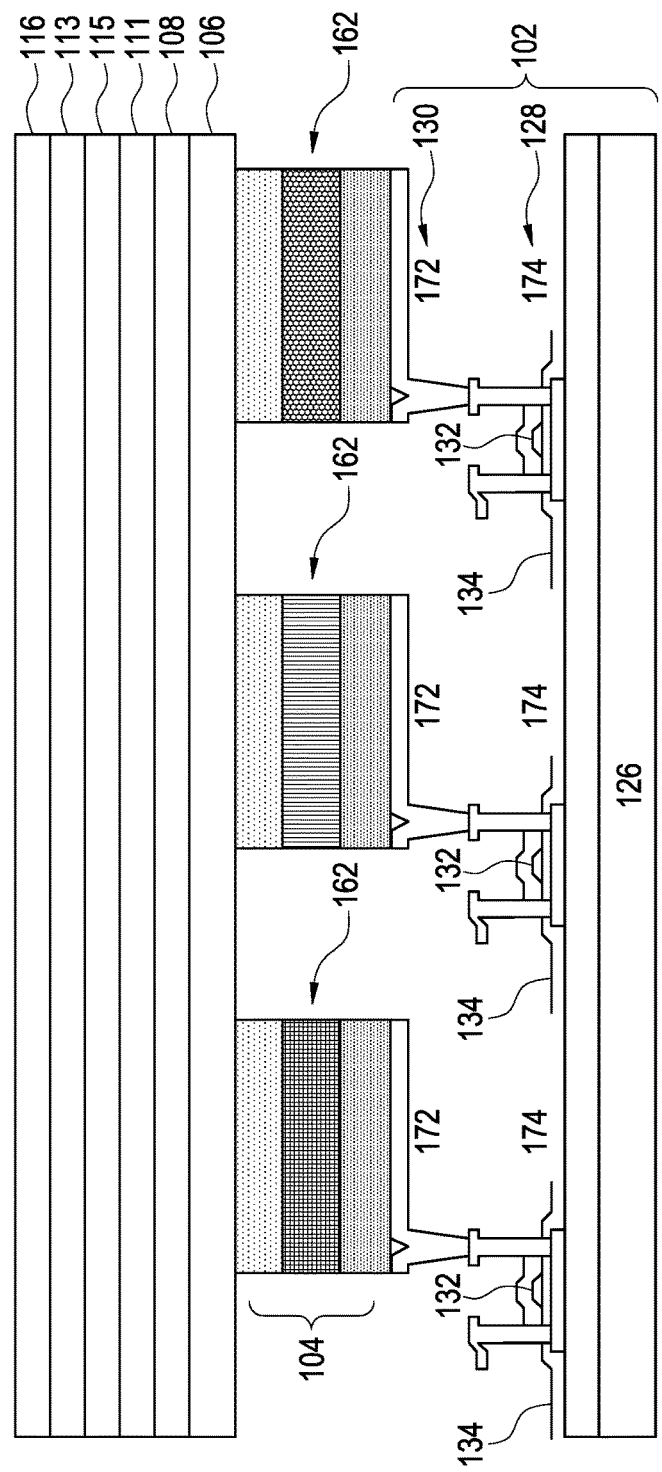

Refer to FIG. 9, FIG. 9 shows a detailed structural diagram of the touch display apparatus 10 corresponding to embodiments shown in FIG. 1B and FIG. 7. As shown in FIG. 9, the pixel electrode layer 130 includes a plurality of pixel electrodes 172; the thin film transistor layer 128 includes a plurality of thin film transistors 174. The pixel electrodes 172 are arranged to correspond to the thin film transistors 174, and a polarity of the plurality of pixel electrodes 172 is also reverse to that of the common electrode layer 106. The thin film transistors 174 are arranged on the transistor substrate 126. The thin film transistor substrate 102 further includes a plurality of gate lines 132 and a plurality of data lines 134, the gate lines 132 are electrically connected to the thin film transistors 174 respectively, the data lines 134 are electrically connected to the thin film transistors 174 respectively. Besides, the organic light emitting material layer 104 includes a hole transporting layer (HTL) and an electron transporting layer (ETL), and a plurality of organic light emitting materials 162 are arranged between the HTL and the ETL. The organic light emitting materials 162 in the organic light emitting material layer 104 shown in FIG. 9 emit light with colors different from each other, for example, materials emitting red light, green light, and blue light respectively.

Figure 4A:
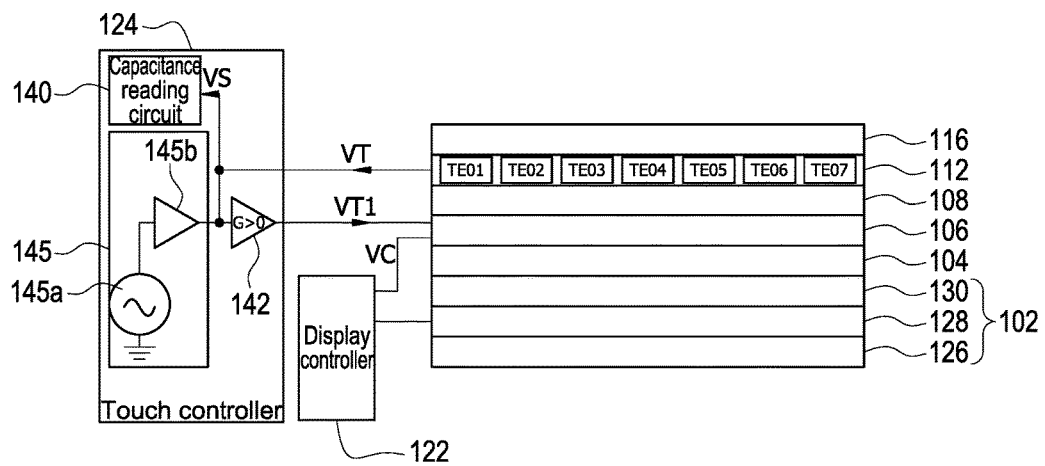
FIGS. 4A-4B show schematic views of operation of self-capacitance organic light emitting touch display apparatuses according to different embodiments of the present invention.

Refer to FIG. 4A, FIG. 4A shows schematic view of operation of a self-capacitance organic light emitting touch display apparatus according to an embodiment of the present invention. The self-capacitance organic light emitting touch display apparatus may be, for example, the touch display apparatus 10 shown in FIGS. 1A, 1B. During touch sensing, a capacitance exciting driving circuit 145 of the touch controller 124 of the touch display apparatus 10 sequentially or randomly applies a capacitance exciting signal VT to a selected touch sensing electrode TEn, and senses a touch sensing signal Vs at the selected touch sensing electrode TEn, the touch sensing signal Vs is read at the capacitance reading circuit 140. The touch controller 124 applies the touch sensing signal Vs to an amplifier 142 with a gain larger than zero for processing, to generate a shielding reflection signal VT1, the shielding reflection signal VT1 is applied to the common electrode layer 106, to facilitate the touch sensing operation of the touch display apparatus 10. Besides, during touch operation, the display controller 122 may sequentially output a scan signal to the gate line 132 shown in FIG. 8, the display controller 122 outputs data signal to each of the data lines 134 shown in FIG. 8, and the display controller 122 outputs a predetermined volt signal VC (such as a zero volt signal, negative volt signal, or positive volt signal) to the common electrode layer 106 for display operation at the same time.

Figure 4B:
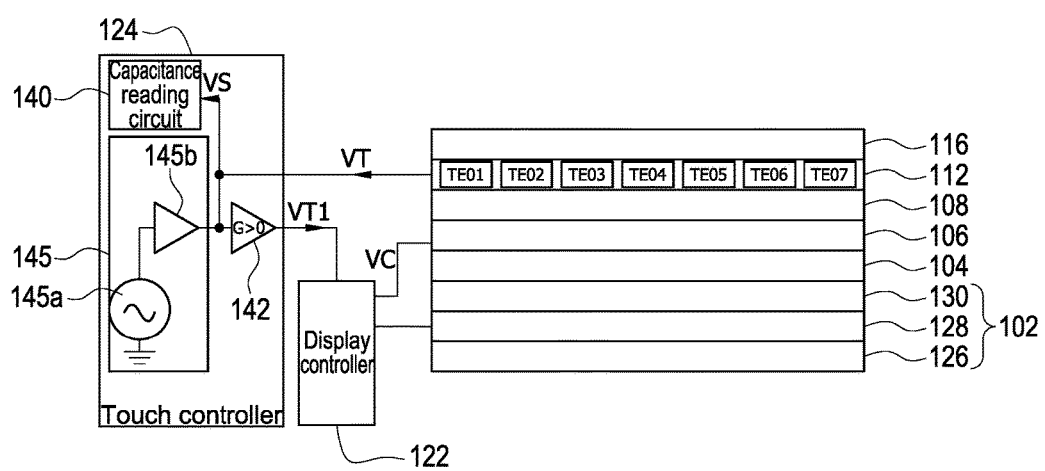

Refer to FIG. 4B, FIG. 4B shows schematic view of operation of a self-capacitance organic light emitting touch display apparatus according to an embodiment of the present invention. The self-capacitance organic light emitting touch display apparatus may be, for example, the touch display apparatus 10 shown in FIGS. 1A, 1B. During touch sensing, a capacitance exciting driving circuit 145 of the touch controller 124 of the touch display apparatus 10 sequentially or randomly applies a capacitance exciting signal VT to a selected touch sensing electrode TEn, and senses a touch sensing signal Vs at the selected touch sensing electrode TEn, the touch sensing signal Vs is read at the capacitance reading circuit 140. The touch controller 124 applies the touch sensing signal Vs to an amplifier 142 with a gain larger than zero for processing, to generate a shielding reflection signal VT1, the shielding reflection signal VT1 is applied to a reference point (for example, a power output point, a grounded point, a node of DC loop, or an output point of a display signal driving stage of the display controller 122) of the display controller 122, for the touch display apparatus 10 to perform touch sensing. The shielding reflection signal VT1 may be indirectly applied to the common electrode layer 106 through the display controller 122, to improve accuracy of the touch sensing.

Figure 5A:
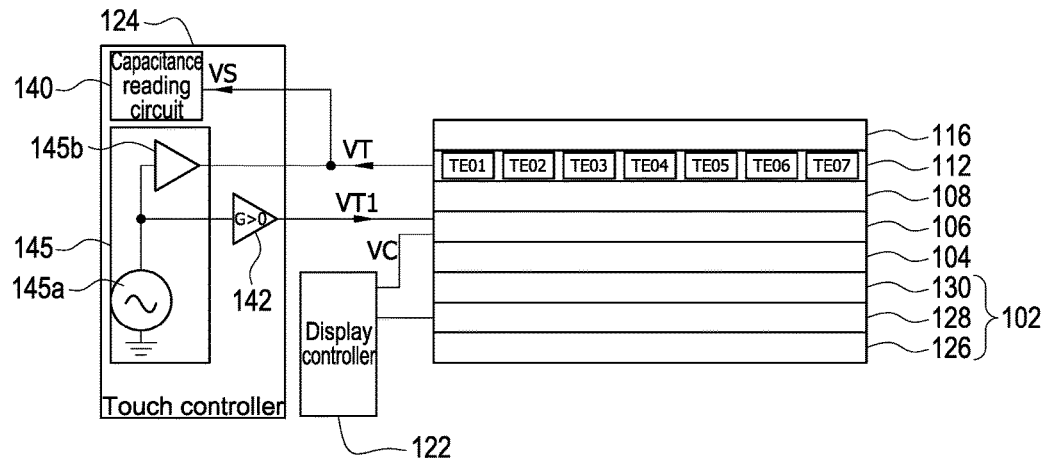
FIG. 5A-5B show schematic views of operation of self-capacitance organic light emitting touch display apparatuses according to different embodiments of the present invention.

Refer to FIG. 5A, FIG. 5A shows a schematic view of operation of a self-capacitance organic light emitting touch display apparatus according to an embodiment of the present invention. The self-capacitance organic light emitting touch display apparatus may be, for example, the touch display apparatus 10 shown in FIGS. 1A, 1B. During touch sensing, a capacitance exciting driving circuit 145 of the touch controller 124 of the touch display apparatus 10 sequentially or randomly applies a capacitance exciting signal VT to a selected touch sensing electrode TEn, and senses a touch sensing signal Vs at the selected touch sensing electrode TEn. In the embodiment, the touch controller 124 applies the capacitance exciting signal VT to an amplifier 142 with a gain larger than zero for processing, to generate a shielding reflection signal VT1. Alternatively, the touch controller 124 may directly apply output of the signal source 145a to the amplifier 142 with a gain larger than zero for processing, to generate the shielding reflection signal VT1. The shielding reflection signal VT1 is applied to the common electrode layer 106 to facilitate the touch sensing operation of the touch display apparatus 10.

Figure 5B:
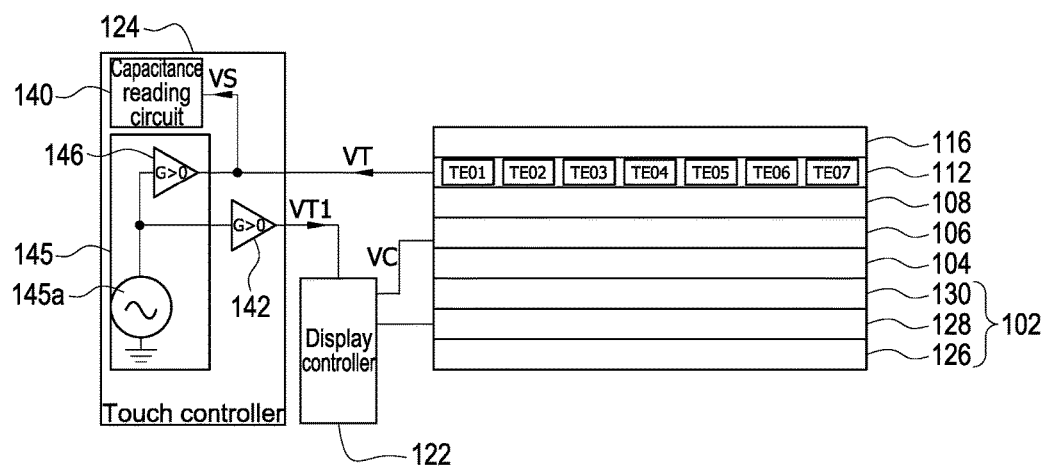

Refer to FIG. 5B, FIG. 5B shows a schematic view of operation of a self-capacitance organic light emitting touch display apparatus according to an embodiment of the present invention. The self-capacitance organic light emitting touch display apparatus may be, for example, the touch display apparatus 10 shown in FIGS. 1A, 1B. During touch sensing, a capacitance exciting driving circuit 145 of the touch controller 124 of the touch display apparatus 10 sequentially or randomly applies a capacitance exciting signal VT to a selected touch sensing electrode TEn, and senses a touch sensing signal Vs at the selected touch sensing electrode TEn. In the embodiment, the touch controller 124 applies the capacitance exciting signal VT to an amplifier 142 with a gain larger than zero for processing, to generate a shielding reflection signal VT1. Alternatively, the touch controller 124 directly applies output of the signal source 145a to the amplifier 142 with a gain larger than zero for processing, to generate the shielding reflection signal VT1. The shielding reflection signal VT1 is applied to a reference point (for example, a power output point, a grounded point, a node of DC loop, or an output point of a display signal driving stage of the display controller 122) of the display controller 122, to facilitate the touch sensing operation of the touch display apparatus 10. The shielding reflection signal VT1 may also be indirectly applied, through the display controller 122, to the common electrode layer 106, to improve accuracy of touch sensing. In embodiments shown in FIGS. 5A-5B, the input of the amplifier 142 with gain larger than zero does not connect the capacitance reading circuit 140, wherein the input of the amplifier 142 generates the shielding reflection signal VT1, to avoid influence of noise from the capacitance reading circuit 140.

Similarly, in embodiments shown in FIGS. 4A-4B, 5A-5B, during touch operation, the display controller 122 may sequentially outputs a scan signal to the gate line 132 shown in FIG. 8, the display controller 122 outputs data signal to each of the data lines 134 shown in FIG. 8, and the display controller 122 outputs a predetermined volt signal VC (such as a zero volt signal, negative volt signal, or positive volt signal) to the common electrode layer 106 for display operation.

Figure 2A:
FIGS. 2A-2C show stack diagrams of self-capacitance organic light emitting touch display apparatuses according to different embodiments of the present invention.
Figure 2B:
Figure 2C:

Refer to FIG. 2A, FIG. 2A shows a stack diagram structure of the touch display apparatus 10 according to another embodiment of the present invention. The embodiment shown in FIG. 2A is similar to that shown in FIG. 1A, and distribution of the touch sensing electrodes TEn may be referred to the embodiment shown in FIG. 6. However, the organic light emitting material layer 104 in this embodiment only emits white light, thus additional black matrix layer 158 and color filtering layer 160 are needed. The embodiments shown in FIGS. 2B and 2C are similar to that in FIG. 2A, and the distribution of the touch sensing electrodes TEn may be referred to the embodiment shown in FIG. 6, but positions of the touch electrode layer 112, black matrix layer 158 and color filtering layer 160 are different. According to embodiments of the touch display apparatus 10 shown in FIGS. 2A-2C, the touch sensing architectures shown in FIGS. 4A-4B, 5A-5B also may be adopted.

Figure 3A:
FIGS. 3A-3B show stack diagrams of self-capacitance organic light emitting touch display apparatuses according to different embodiments of the present invention.

Refer to FIG. 3A, which shows a stack diagram of the touch display apparatus 10 according to another embodiment of the present invention. The embodiment shown in FIG. 3A is similar to those shown in FIGS. 2B and 2C, and distribution of the touch sensing electrodes TEn may be referred to the embodiment shown in FIG. 6. However, the embodiment shown in FIG. 3A uses a black metal grid touch electrode layer 112a (with reference to FIG. 18, the black metal grid touch electrode layer has a plurality of black metal grid touch sensing electrodes TEn) to replace the black matrix layer 158 and the touch electrode layer 112. Because the touch electrode layer is formed by black metal grid, a grid polygon connected by metal line segments provides light shading and also may be used as touch sensing electrode.

Figure 3B:

Refer to FIG. 3B, which shows a stack diagram of the touch display apparatus 10 according to an embodiment of the present invention. Similar to the touch display apparatus 10 shown in FIG. 1B, the distribution of the touch sensing electrodes of the embodiment may be referred to that in FIG. 7. However, the organic light emitting material layer 104 of the embodiment shown in FIG. 3B only emits white light, thus additional black matrix layer 158 and color filtering layer 160 are needed. Moreover, the embodiment shown in FIG. 5B uses a black metal grid touch electrode layer 113a (refer to FIG. 18) to replace the black matrix layer and the second touch electrode layer 113 in FIG. 1B. Because the black metal grid touch electrode layer 113a is formed by metal grid, the black metal grid touch electrode layer 113a provides light shading and may also be used as the upper second touch sensing electrode, which together with the first touch sensing electrode of the lower first touch electrode layer 111, may be used as the touch sensing electrode for self-capacitance sensing. According to the touch display apparatus 10 of the embodiments shown in FIGS. 3A-3B, the touch sensing architectures shown in FIGS. 4A-4B, 5A-5B also may be adopted for touch sensing.

Figure 10:
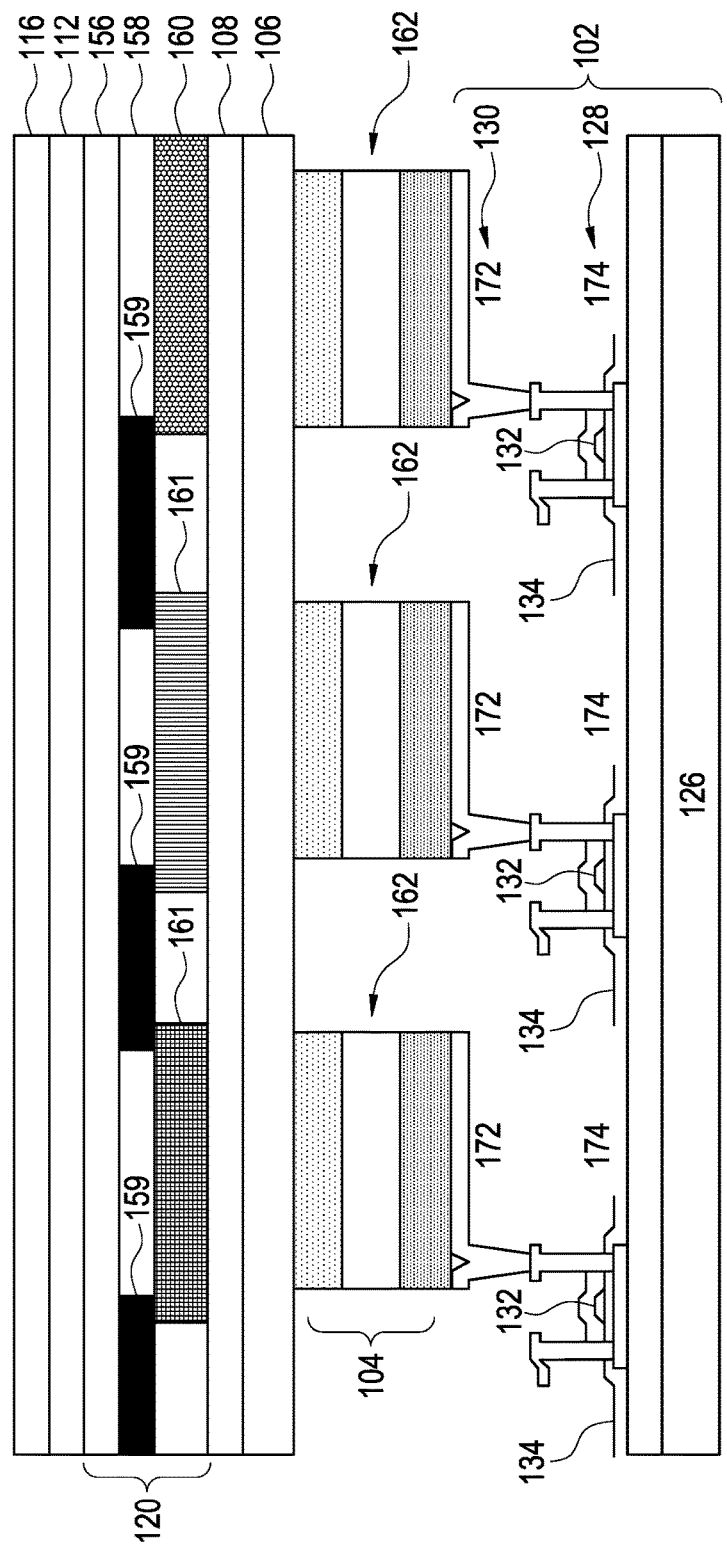

Refer to FIG. 10, FIG. 10 shows detailed structure diagram corresponding to embodiments in FIG. 2B and FIG. 6. The organic light emitting materials 162 in the organic light emitting material layer 104 shown in FIG. 10 are materials only emitting white light, thus additional color filtering structure 120 is needed. The color filtering structure 120 includes a color filtering substrate 156, a black matrix layer 158 and a color filtering material layer 160. The black matrix layer 158 blocks the skewed light. The black matrix layer 158 and the color filtering material layer 160 are arranged on the color filtering substrate 156. The organic light emitting materials 162 in the organic light emitting material layer 104 shown in FIG. 10 are materials emitting only white light, while the color filtering materials 161 have colors different from each other, the color filtering materials 161 respectively are red, green, and blue.

Figure 11:
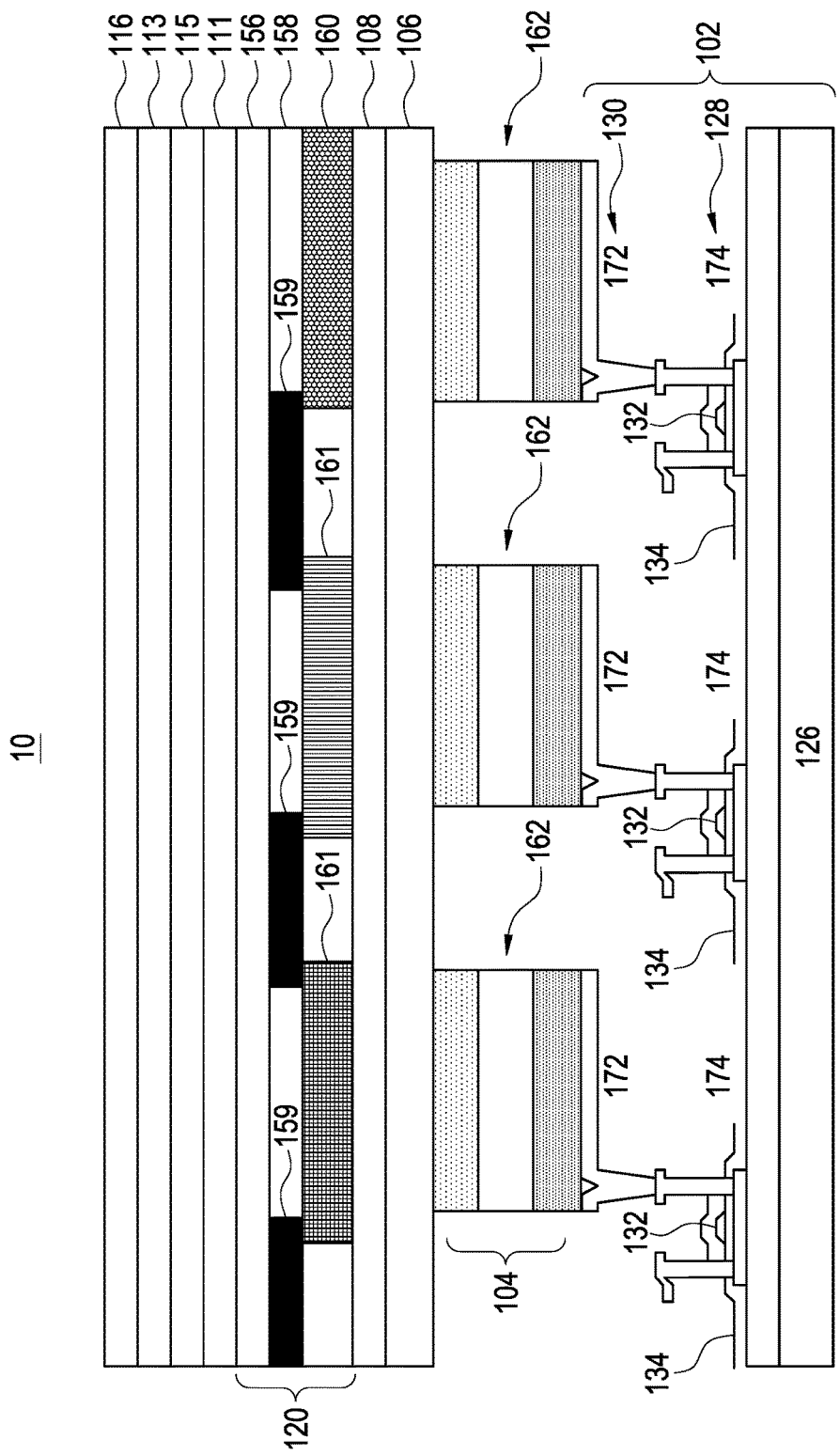
Figure 12:
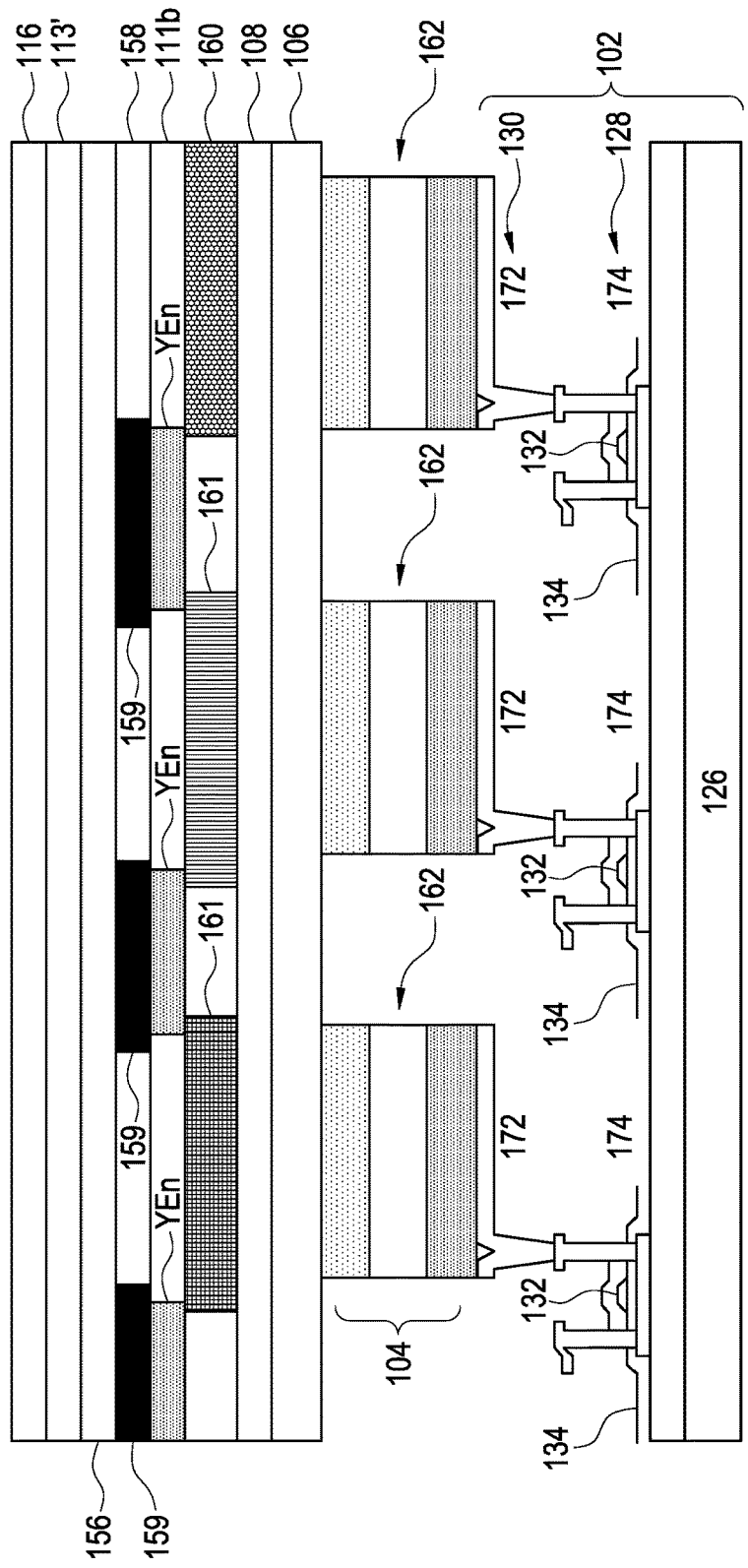

Refer to FIG. 11, FIG. 11 shows detailed structural diagram of the touch display apparatus 10 according to an embodiment of the present invention. The embodiment shown in FIG. 12 is similar to that in FIG. 9, while the organic light emitting materials 162 in the organic light emitting material layer 104 shown in FIG. 11 are materials only emitting white light, thus additional color filtering structure 120 is needed. The color filtering structure 120 includes a color filtering substrate 156, a black matrix layer 158 and a color filtering material layer 160. The black matrix layer 158 blocks the skewed light. The black matrix layer 158 and the color filtering material layer 160 are arranged on the color filtering substrate 156. The organic light emitting materials 162 in the organic light emitting material layer 104 shown in FIG. 11 are materials only emitting white light, and the color filtering materials 161 have colors different from each other, the color filtering materials 161 respectively are red, green, and blue.

Refer to FIG. 12, FIG. 12 shows a detailed structural diagram of the touch display apparatus 10 according to an embodiment of the present invention. The embodiment shown in FIG. 12 is similar to that in FIG. 11, while the first touch electrode layer is the metal grid touch electrode layer 111b formed by metal grid and arranged below the black matrix layer 158. Because the color filtering substrate 156 can provide isolation effect, thus the insulation layer 115 in FIG. 11 may be omitted. Similarly, the touch sensing electrodes in the upper touch electrode layer 113' and metal grid touch electrode layer 111b may be used as the touch sensing electrodes for self-capacitance sensing.

Figure 13:
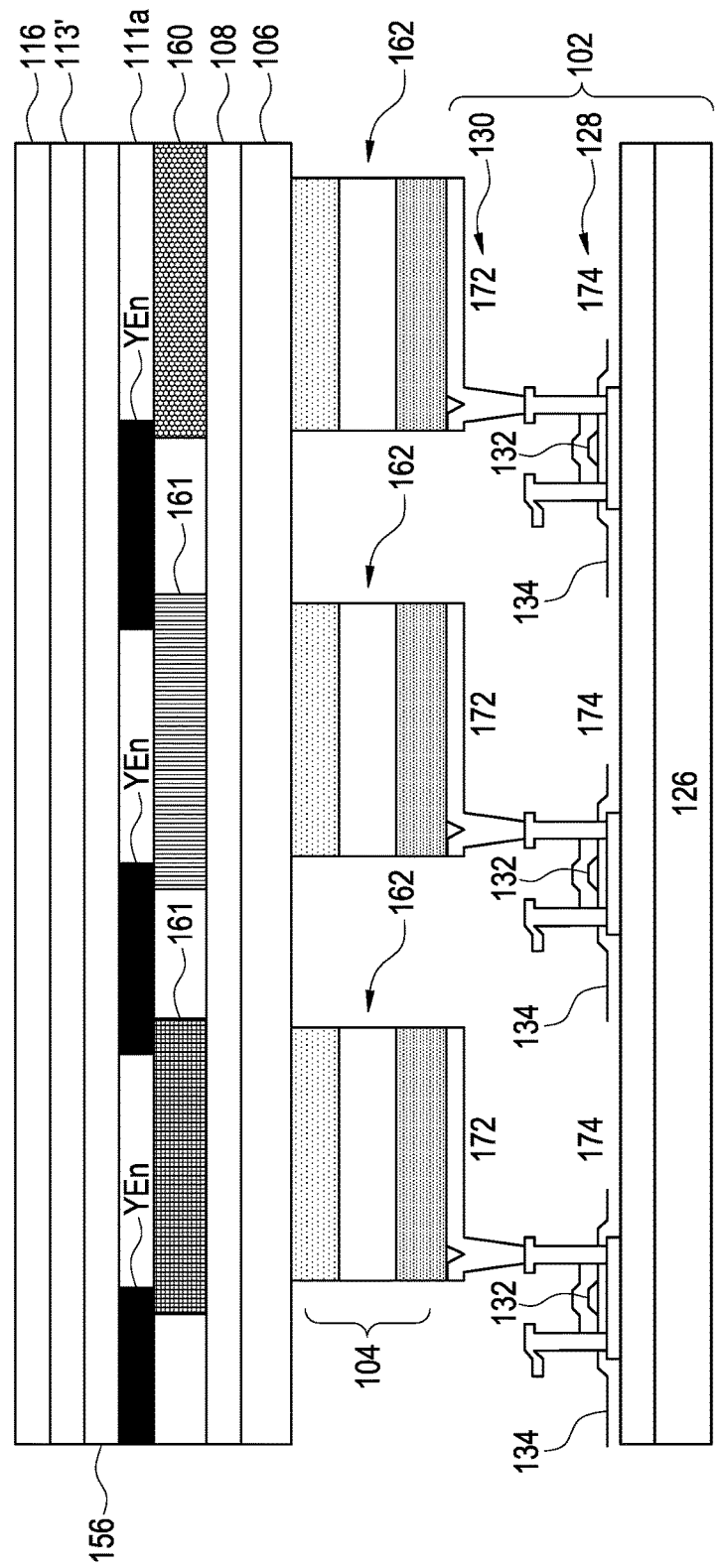

Refer to FIG. 13, FIG. 13 shows a detailed structural diagram of the touch display apparatus 10 according to an embodiment of the present invention. The embodiment shown in FIG. 13 is similar to that in FIG. 11, while the first touch electrode layer 111 is the black metal grid touch electrode layer 111a formed by black metal grid. Because the black metal grid touch electrode layer 111a is formed by black metal grid, the black metal grid touch electrode layer 111a provides light shading to replace the black matrix layer, and the section of metal grid also may be used as the lower first touch sensing electrode. Moreover, because the color filtering substrate 156 can provide isolation, thus the insulation layer 115 in FIG. 11 may be omitted. Similarly, the touch sensing electrodes in the upper touch electrode layer 113' and the black metal grid touch electrode layer 111a can be used as the touch sensing electrodes for self-capacitance sensing.

Figure 14:
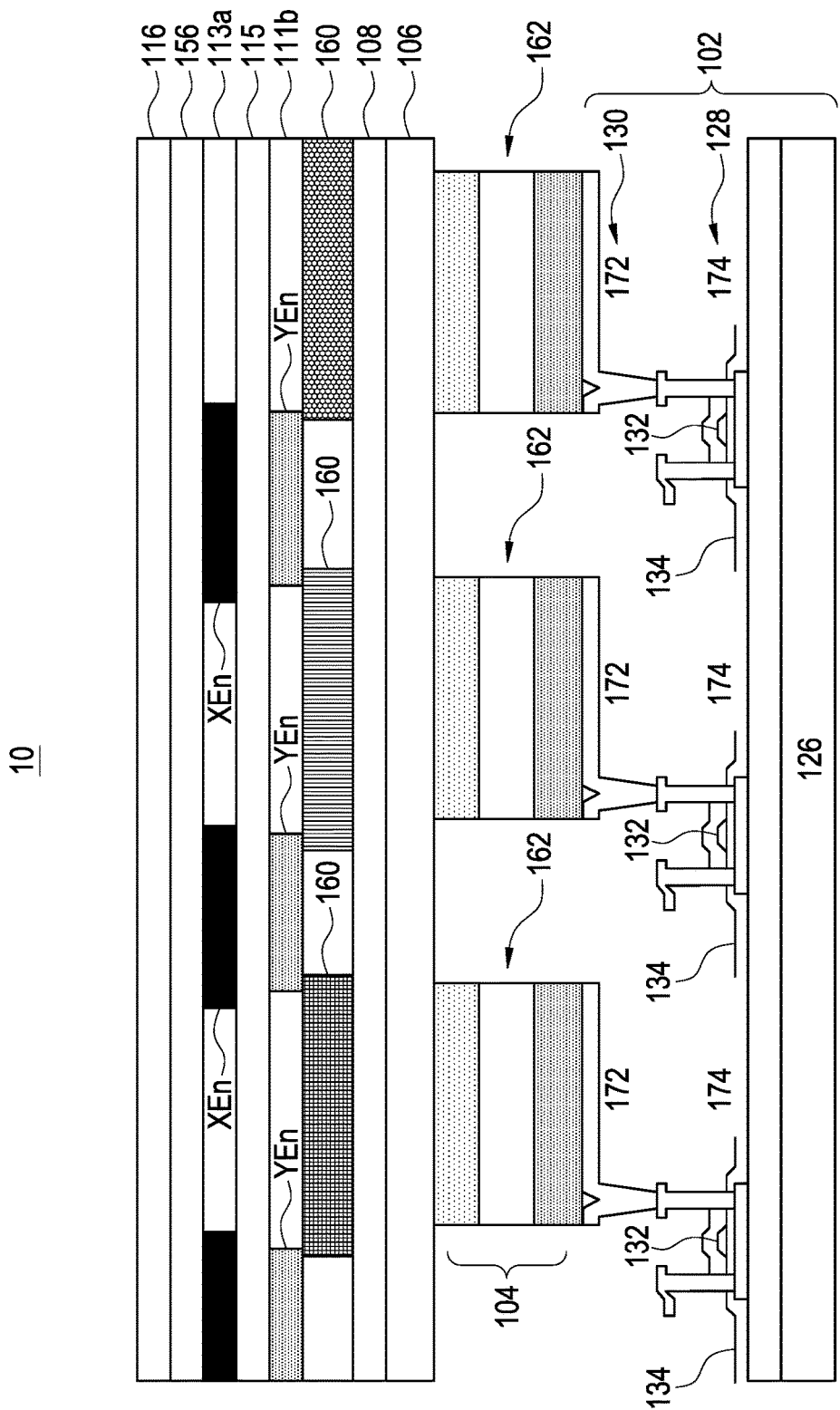

Refer to FIG. 14; FIG. 14 shows a detailed structural diagram of touch the display apparatus 10 according to an embodiment of the present invention. The embodiment shown in FIG. 14 is similar to that in FIG. 11, while the first touch electrode layer 111 is the metal grid touch electrode layer 111b formed by metal grid, the second touch metal layer 113 is the black metal grid touch electrode layer 113a formed by black metal grid. Because the black metal grid can provide light shading, thus the black matrix layer may be omitted. Similarly, the touch sensing electrodes in the upper black metal grid touch electrode layer 113a and the lower metal grid touch electrode layer 111b can be used as the touch sensing electrodes for self-capacitance sensing.

Figure 15:
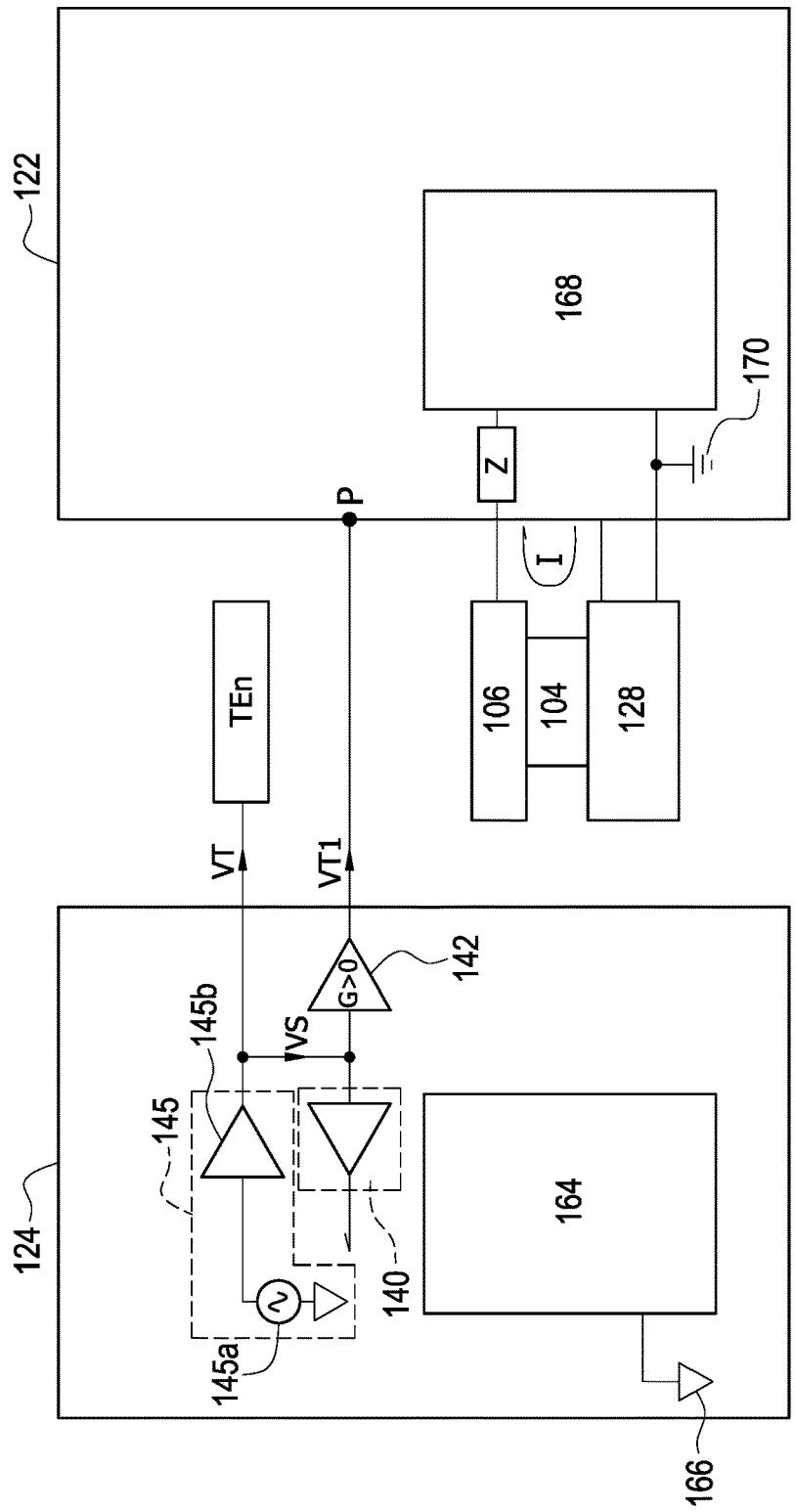
FIG. 15-17 show schematic views of operation of a self-capacitance organic light emitting touch display apparatus of the present invention.

Please refer to FIG. 15, FIG. 15 shows a schematic view of operation of the touch display apparatus 10 of the present invention. The touch display apparatus 10 according to the present invention can be implemented with embodiments shown in FIGS. 1-14, however person skilled in the field can know that according to the present invention, the self-capacitance touch sensing method with high sensitivity can still be adopted to other self-capacitance organic light emitting touch display apparatus 10. The touch display apparatus 10 according to the present invention at least includes a plurality of touch sensing electrodes TEn (such as touch sensing electrodes TE01-TE16 in FIG. 6), and a touch controller 124. The touch controller 124 includes a capacitance exciting driving circuit 145 (including a signal source 145a and a driving circuit 145b), a capacitance reading circuit 140, an amplifier 142 with a gain larger than zero (a non-inverting amplifier). Besides, the touch controller 124 further includes a touch power source 164 and a touch grounded end 166. The touch display apparatus 10 further includes a display controller 122, a display power source 168, a display grounded end 170 and impedance Z.

During touch sensing, the capacitance exciting driving circuit 145 of the touch controller 124 of the touch display apparatus 10 sequentially or randomly applies a capacitance exciting signal VT to a selected touch sensing electrode TEn, and senses a touch sensing signal Vs at the selected touch sensing electrode TEn, the touch sensing signal Vs is read by the capacitance reading circuit 140. The touch controller 124 applies the touch sensing signal Vs to the amplifier 142 with a gain larger than zero for processing, to generate a shielding reflection signal VT1, the shielding reflection signal VT1 is applied to a reference point P of the display controller 122, for example, a power output point, a grounded point, a node of DC loop, or an output point of a display signal driving stage of the display controller 122, and indirectly connects the common electrode layer 106 by the display controller 122 and a impedance Z.

Figure 16:
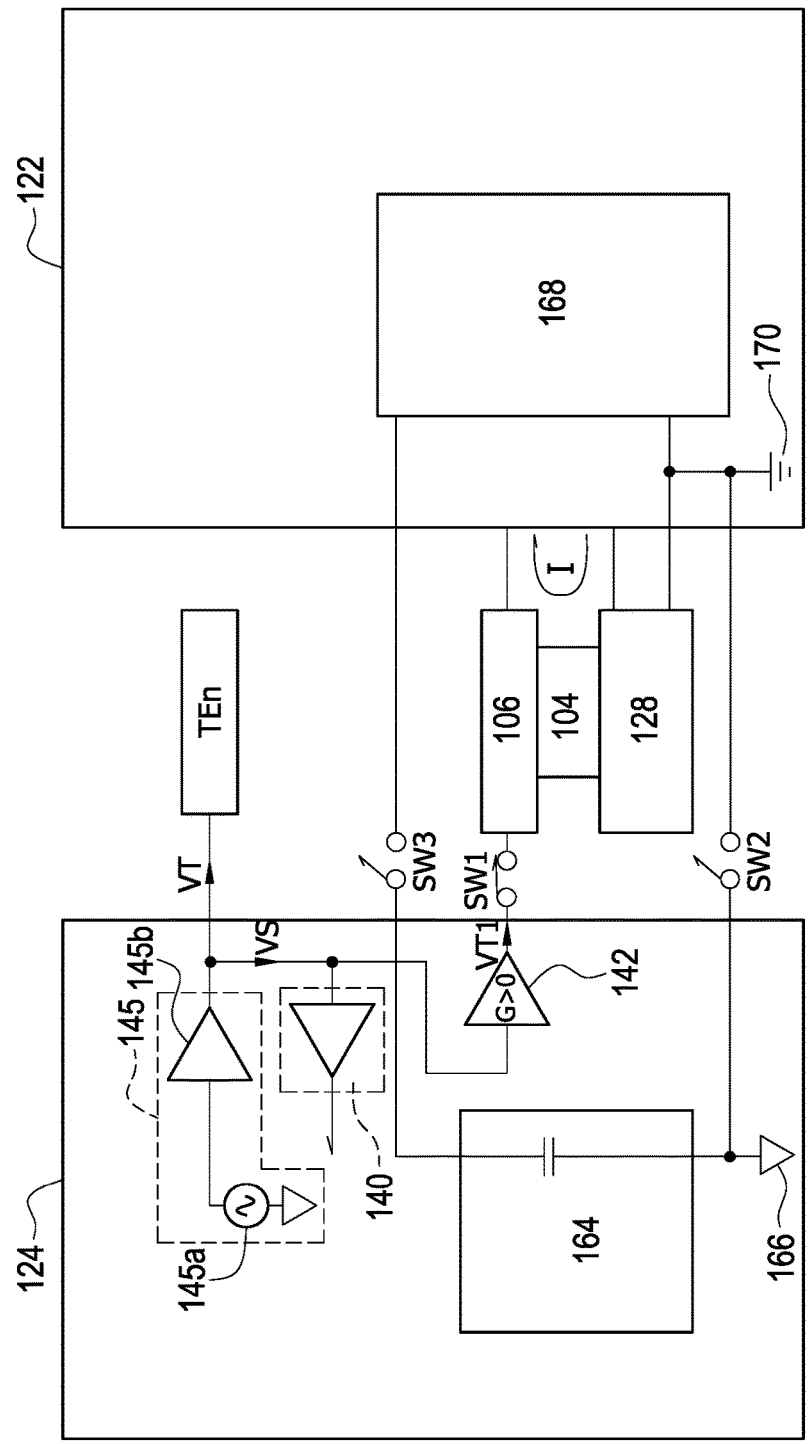

Refer to FIG. 16, FIG. 16 shows a schematic view of operation of the touch display apparatus 10 of the present invention. Compared with the embodiment in FIG. 15, the touch display apparatus 10 further includes a first switch SW1 connected between the amplifier 142 and the common electrode layer 106, a second switch SW2 connected between the touch grounded end 166 and the display grounded end 170, and a third switch SW3 connected between the touch power source 164 and the display power source 168.

During touch sensing, the capacitance exciting driving circuit 145 of the touch controller 124 of the touch display apparatus 10 sequentially or randomly applies a capacitance exciting signal VT to a selected touch sensing electrode TEn, and senses a touch sensing signal Vs at the selected touch sensing electrode TEn, the touch sensing signal Vs is read by the capacitance reading circuit 140. The touch controller 124 applies the touch sensing signal Vs to the amplifier 142 with a gain larger than zero for processing, to generate a shielding reflection signal VT1, the shielding reflection signal VT1 is applied to the common electrode layer 106 by the first switch SW1 (turned on). Besides, during touch operation, the second switch SW2 and the third switch SW3 are turned off. Because there is only a single physical connection point (connected by the first switch SW1) between the display controller 122 and the touch controller 124, and the touch grounded end 166 and the display grounded end 170 are different grounded ends, thus there is no common current loop between the display controller 122 and the touch controller 124, and the noise of the display controller 122 is prevented from influencing measuring of the touch controller 124. In time not during the touch operation, the first switch SW1 may also be turned off, and the second switch SW2 and third switch SW3 may be turned on, to make the display power source 168 charge the touch power source 164.

Figure 17:
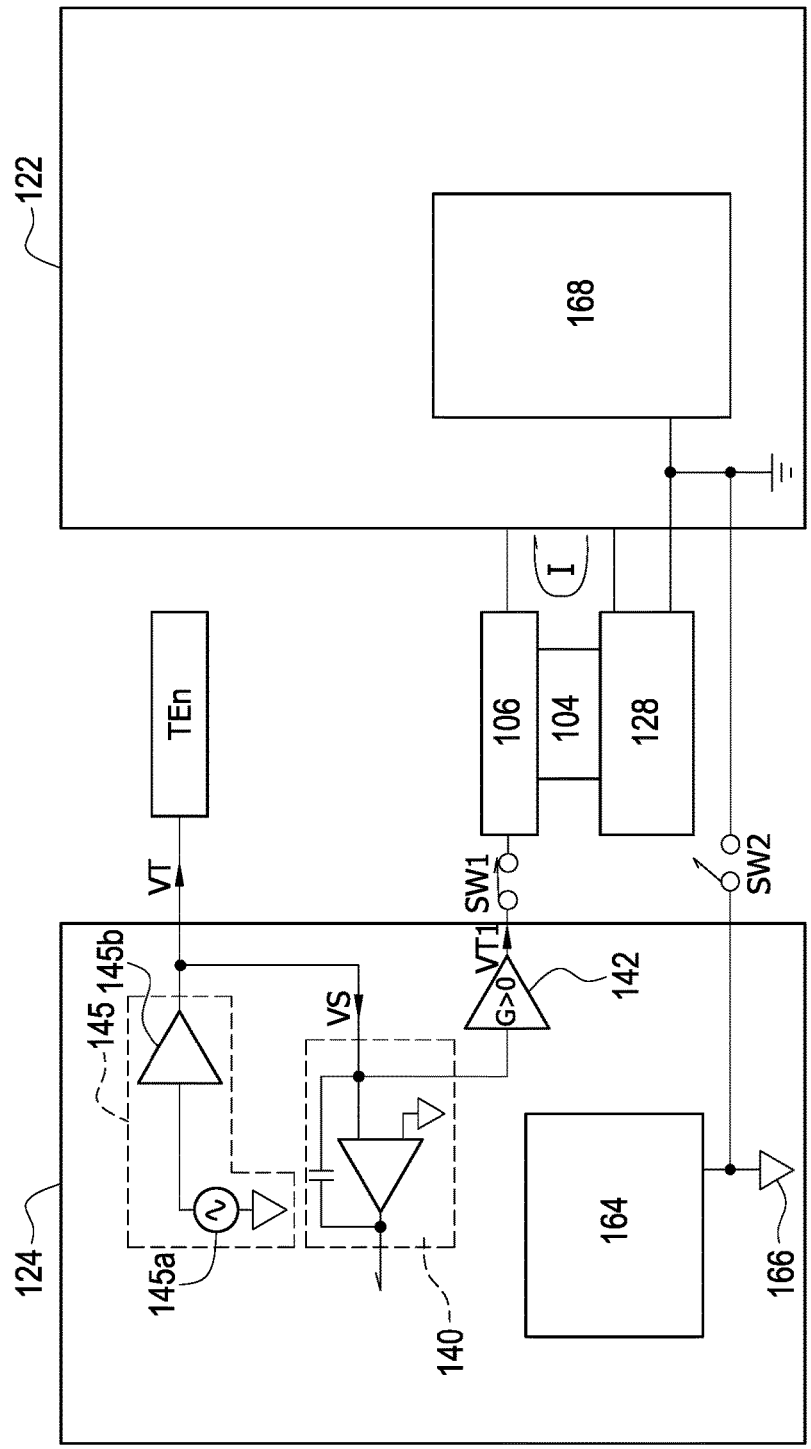

Refer to FIG. 17, FIG. 17 shows a schematic view of operation of the touch display apparatus 10 of the present invention. Compared with the embodiment in FIG. 16, the touch display apparatus can omit the third switch SW3. During touch sensing, the capacitance exciting driving circuit 145 of the touch controller 124 of the touch display apparatus 10 sequentially or randomly applies a capacitance exciting signal VT to a selected touch sensing electrode TEn, and senses a touch sensing signal Vs at the selected touch sensing electrode TEn, the touch sensing signal Vs is read by the capacitance reading circuit 140. The touch controller 124 applies the touch sensing signal Vs to the amplifier 142 with a gain larger than zero for processing, to generate a shielding reflection signal VT1, the shielding reflection signal VT1 is applied the common electrode layer 106 by the first switch SW1 (turned on). Besides, during touch operation, the second switch SW2 is turned off. Because there is only a single physical connection point (connected by the first switch SW1) between the display controller 122 and the touch controller 124, and the touch grounded end 166 and the display grounded end 170 are different grounded ends, thus there is no common current loop between the display controller 122 and the touch controller 124, and the noise of the display controller 122 is prevented from influencing measuring of the force touch controller 124.

Thus, particular embodiments have been described. Other embodiments are within the scope of the following claims. For example, the actions recited in the claims may be performed in a different order and still achieve desirable results.

What is claimed is:

1. A self-capacitance organic light emitting touch display apparatus comprising:
    a thin film transistor substrate having a plurality of thin film transistors, a plurality of pixel electrodes, a plurality of gate lines and a plurality of data lines arranged on a surface of the thin film transistor substrate, wherein the thin film transistors are respectively connected to the pixel electrodes, the gate lines and the data lines corresponding to the thin film transistors;
    a common electrode layer;
    an organic light emitting material layer arranged between the common electrode layer and the thin film transistor substrate;
    at least one touch electrode layer arranged on a side of the common electrode layer, and the side opposite to the organic light emitting material layer, the at least one touch electrode layer comprising a plurality of touch sensing electrodes;
    a display controller having a display power source, and electrically connected to the thin film transistors, the pixel electrodes and the common electrode layer;
    a touch controller comprising a touch power source, the touch controller sequentially or randomly applying a capacitance exciting signal to a selected touch sensing electrode, and sensing a touch sensing signal at the selected touch sensing electrode, the touch controller also applying a shielding reflection signal to the common electrode layer or a reference point of the display controller, for the touch controller performing touch sensing, and no common current loop being present between the display controller and the touch controller during touch sensing;
    wherein the display controller has a display grounded end and the touch controller has a touch grounded end, and the display grounded end is different from the touch grounded end; and
    wherein the display controller is electrically connected with the touch controller through only one physical connection point during touch sensing.

2. The self-capacitance organic light emitting touch display apparatus of claim 1, wherein the shielding reflection signal is a signal with same phase as that of the capacitance exciting signal or the touch sensing signal.

3. The self-capacitance organic light emitting touch display apparatus of claim 1, wherein the display controller sequentially outputs a scan signal to a gate line, and outputs a data signal to a data line and outputs a zero volt signal, negative volt signal, or a positive volt signal to the common electrode layer for displaying.

4. The self-capacitance organic light emitting touch display apparatus of claim 1, further comprising at least a switch arranged between the touch controller and the common electrode layer.

5. The self-capacitance organic light emitting touch display apparatus of claim 1, further comprising at least a switch arranged between the touch controller and the display controller.

6. The self-capacitance organic light emitting touch display apparatus of claim 1, further comprising a touch protection layer arranged on a side of the touch electrode layer, and the side being opposite to the organic light emitting material layer, the touch protection layer being a substrate or a cured coating layer.

7. The self-capacitance organic light emitting touch display apparatus of claim 1, wherein the plurality of touch sensing electrodes are transparent conductive electrodes.

8. The self-capacitance organic light emitting touch display apparatus of claim 1, wherein the plurality of touch sensing electrodes are metal grid electrodes.

9. The self-capacitance organic light emitting touch display apparatus of claim 8, wherein the plurality of touch sensing electrodes are black metal grid electrodes.

10. The self-capacitance organic light emitting touch display apparatus of claim 6, further comprising a color filtering layer and a black matrix layer arranged between the touch protection layer and the common electrode layer.

11. The self-capacitance organic light emitting touch display apparatus of claim 10, wherein the plurality of touch sensing electrodes are metal grid electrodes, and the metal grid electrodes are arranged at positions corresponding to the black matrix layer.

12. The self-capacitance organic light emitting touch display apparatus of claim 1, wherein a reference point of the display controller is a power output point, a grounded point, a node of DC loop, or an output point of a display signal driving stage of the display controller.

* * * * *